United States Patent
Janssens et al.

(10) Patent No.: US 9,425,266 B2
(45) Date of Patent: Aug. 23, 2016

(54) INTEGRATED FLOATING DIODE STRUCTURE AND METHOD THEREFOR

(71) Applicant: SEMICONDUCTOR COMPONENTS INDUSTRIES, LLC, Phoenix, AZ (US)

(72) Inventors: Johan Camiel Julia Janssens, Asse (BE); Jaroslav Pjencak, Dolni Becva (CZ)

(73) Assignee: SEMICONDUCTOR COMPONENTS INDUSTRIES, LLC, Pheonix, AZ (US)

( * ) Notice: Subject to any disclaimer, the term of this patent is extended or adjusted under 35 U.S.C. 154(b) by 0 days.

(21) Appl. No.: 14/512,936

(22) Filed: Oct. 13, 2014

(65) Prior Publication Data

US 2016/0104781 A1    Apr. 14, 2016

(51) Int. Cl.
  *H01L 29/36*   (2006.01)
  *H01L 23/60*   (2006.01)
  *H01L 21/761*  (2006.01)
  *H01L 29/861*  (2006.01)
  *H01L 29/06*   (2006.01)
  *H01L 29/40*   (2006.01)
  *H01L 29/66*   (2006.01)

(52) U.S. Cl.
  CPC .............. *H01L 29/36* (2013.01); *H01L 21/761* (2013.01); *H01L 23/60* (2013.01); *H01L 29/0657* (2013.01); *H01L 29/401* (2013.01); *H01L 29/6609* (2013.01); *H01L 29/861* (2013.01); *H01L 29/8611* (2013.01); *H01L 2924/0002* (2013.01)

(58) Field of Classification Search
  CPC ... H01L 29/36; H01L 29/401; H01L 29/0657; H01L 29/6609; H01L 29/861
  See application file for complete search history.

(56) References Cited

U.S. PATENT DOCUMENTS

| | | | |
|---|---|---|---|
| 7,095,092 B2 * | 8/2006 | Zhu ...................... | H01L 29/861 257/506 |
| 8,264,038 B2 | 9/2012 | Pendharkar et al. | |
| 8,338,872 B2 | 12/2012 | Khemka et al. | |
| 2009/0230500 A1* | 9/2009 | Yoshikawa .......... | H01L 27/0255 257/470 |
| 2015/0002967 A1* | 1/2015 | Kawase ................ | H02H 9/046 361/56 |

* cited by examiner

*Primary Examiner* — Michelle Mandala
(74) *Attorney, Agent, or Firm* — Kevin B. Jackson

(57) ABSTRACT

In one embodiment, a floating diode structure includes a p-type semiconductor substrate. An n-type doped region is disposed between the semiconductor substrate and a p-type doped region of the first conductivity type adjacent the first doped region. An n-type cathode region is disposed within the p-type doped region and a p-type anode region is disposed within the cathode region. An anode electrode is connected to the anode region and a cathode electrode is connected to the cathode region. In one embodiment, the cathode electrode is further connected to the p-type doped region. The n-type doped region is configured as a floating region that facilitates the diode operating in both a forward and reverse bias mode and both below ground and above ground with respect to the p-type semiconductor substrate.

20 Claims, 8 Drawing Sheets

INTEGRATED FLOATING DIODE STRUCTURE AND METHOD THEREFOR

CROSS-REFERENCE TO RELATED APPLICATIONS

Not Applicable.

BACKGROUND

The present invention relates, in general, to electronics and, more particularly, to semiconductor device structures and methods of forming semiconductor devices.

Semiconductor diodes are common device structures used in integrated circuit designs and are typically used to control the direction of current flow. Diodes are two terminal devices with the positive terminal referred to as the anode and negative terminal referred to as the cathode. In general, diodes have two modes of operation: forward bias with substantial current conduction, and reverse bias with negligible current conduction.

In most integrated circuit devices utilizing bulk semiconductor substrate technology, both the cathode terminal and the anode terminal need to be biased either positive or negative versus the potential or bias of the bulk substrate in which the diode is formed, and designers have been required to pre-select which bias (i.e., positive or negative) will be used in the integrated circuit application. Otherwise diode structures, such as isolation structures (i.e., parasitic diodes become forward biased), start conducting current, which leads to, among other things, unwanted large currents, latch-up phenomena, permanent electrical shorts, and noise issues if the wrong bias is encountered during operation. This requirement to pre-select whether the diode terminals are biased either positive or negative versus the substrate potential limits design flexibility particularly in higher voltage automotive applications where large negative voltage spikes, inductive transients, and battery reversal problems often conflict with the bias condition the designer selected. To solve this problem, designers have resorted to using external diodes, which requires added costs, requires extra connective pins, and requires additional printed circuit board space, among other unwanted constraints. Designers have also resorted to silicon-on-insulator (SOI) technologies to solve this problem, but SOI technologies are quite expensive and more difficult to manufacture. Moreover, the buried oxide in SOI creates an extra thermal resistance that is unwanted in many automotive or other high power applications.

Accordingly, it is desirable to have a diode structure and a method of forming the diode structure that enables both a positive bias and a negative bias versus the potential of the bulk substrate in order to increase design flexibility and enhance device performance under adverse operating conditions. It is also desirable for the diode structure to have low current injection into the bulk substrate in order to minimize the effects of parasitic structures adjacent the diode structure, such as parasitic bipolar transistor structures.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. Although the devices are explained herein as certain N-type regions and certain P-type regions, a person of ordinary skill in the art understands that the conductivity types can be reversed and are also possible in accordance with the present description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions.

DETAILED DESCRIPTION OF THE DRAWINGS

In general, the present embodiments relate to a floating diode structure configured for use in, for example, integrated circuit devices. The diode structure is formed adjacent one surface of a region of semiconductor material. The region of semiconductor material includes a high-doped bulk semiconductor substrate. A floating doped region encloses the diode structure and separates the diode structure from the high-doped bulk semiconductor substrate. In one embodiment, the floating doped region includes a buried layer having a doping concentration that reduces current injection into the high-doped bulk semiconductor substrate. The structure is configured to facilitate forward and reverse biasing of the diode at potentials above ground and below ground with respect to the high doped bulk semiconductor substrate and with reduced current injection into the substrate.

Figure 1:
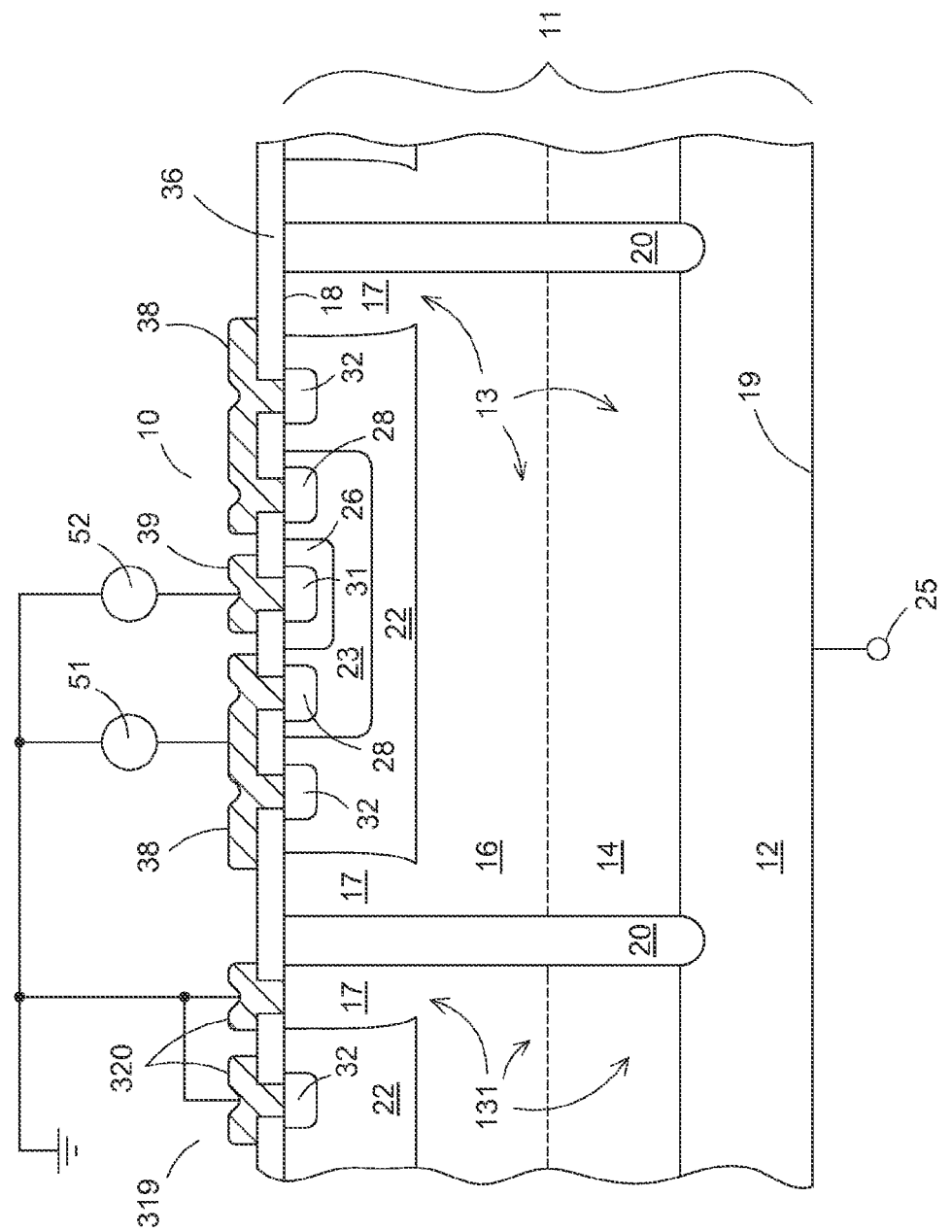
FIG. 1 illustrates a partial cross-sectional view of one embodiment of a semiconductor device in accordance with the present invention.

FIG. 1 illustrates an enlarged partial cross-sectional view of an electronic device 10, a semiconductor device 10, or floating diode device 10 in accordance with one embodiment. In the present embodiment, diode device 10 includes a region of semiconductor material 11, which includes a major surface 18 and an opposing major surface 19. Region of semiconductor material 11 can include a bulk substrate, such as a high doped p-type semiconductor substrate 12 or GPSUB region 12. In one embodiment, semiconductor substrate 12 can be a silicon substrate doped with boron, and can have a dopant concentration in range from about $4.0 \times 10^{18}$ atoms/cm$^3$ to about $1.0 \times 10^{19}$ atoms/cm$^3$ or more. It is understood that semiconductor substrate 12 can include other types of materials including, but not limited to, heterojunction semiconductor materials. Device 10 further includes a doped region 22, doped layer 22, or LPSUB region 22 extending from major surface 18. In one embodiment, doped region 22 can be a p-type conductivity region or layer and can be formed using epitaxial growth techniques, ion implantation and diffusion techniques, or other methods as known to those of ordinary skill in the art. In some embodiments doped region 22 can have a dopant concentration in a range from about $1.0 \times 10^{15}$ atoms/cm$^3$ to about $1.0 \times 10^{16}$ atoms/cm$^3$. In one embodiment, doped region 22 has a dopant concentration of about $3.0 \times 10^{15}$ atoms/cm$^3$.

Device 10 includes a doped region 23 or cathode region 23 within doped region 22 extending from major surface 18 and disposed apart from edge portions of doped region 22. In one embodiment, doped region 23 has an n-type conductivity (i.e., opposite conductivity type to doped region 22). In one embodiment suitable for a 45 volt diode, doped region 23 can have a dopant concentration in range from about $1.0 \times 10^{16}$ atoms/cm$^3$ to about $1.0 \times 10^{17}$ atoms/cm$^3$. In one embodiment, doped region 23 has a dopant concentration of about $4.0 \times 10^{16}$ atoms/cm$^3$.

A doped region 26 or anode region 26 is within doped region 23, extends from major surface 18, and can be disposed apart from edge portions of doped region 23. In the present embodiment, doped region 26 has p-type conductivity. In one embodiment suitable for a 45 volt diode, doped region 26 has a dopant concentration in range from about $1.0 \times 10^{16}$ atoms/cm$^3$ to about $1.0 \times 10^{17}$ atoms/cm$^3$. In one embodiment, doped region 26 has a dopant concentration of about $3.0 \times 10^{16}$ atoms/cm$^3$. In the present embodiment, doped region 26 and doped region 23 are configured as a main component of the diode structure of device 10.

Doped region(s) 28 is formed in portions of doped region 23 and extending from major surface 18. In the present embodiment, doped region 28 has n-type conductivity and has a dopant concentration configured to provide an ohmic-like contact for doped region 23. In one embodiment, doped region 28 is disposed between an edge of doped region 23 and an edge of doped region 26. In one embodiment, doped region 28 laterally surrounds doped region 26. Doped region 31 is formed in a portion of doped region 26. In the present embodiment, doped region 31 has a p-type conductivity and has a dopant concentration configured to provide an ohmic-like contact for doped region 26.

In accordance with the present embodiment, device 10 further includes a doped region 32 formed in portions of doped region 22 and spaced apart from doped region 26. In the present embodiment, doped region 32 has a p-type conductivity and has a dopant concentration configured to provide an ohmic contact for doped region 22. Doped regions 23, 26, 28, 31 and 32 can be formed using ion implantation and diffusion or anneal techniques or using other doping methods as known to those of ordinary skill in the art.

In accordance with the present embodiment, device 10 further includes a doped region 13, doped layer 13, separation layer 13, or NEDGE region 13 disposed between semiconductor substrate 12 and doped region 22. In accordance with one embodiment, doped region 13 is a floating region, which means that no low-ohmic external voltage is imposed on doped region 13. In one embodiment, doped region 13 is configured to include an n-type layer 14 or doped region 14 and an n-type buried layer 16 or buried region 16. In one embodiment, doped region 14 has a lower dopant concentration than buried layer 16. In some embodiments, doped region 14 has a dopant concentration in a range from about $1.0 \times 10^{15}$ atoms/cm$^3$ to about $1.0 \times 10^{16}$ atoms/cm$^3$, and buried layer 16 has a dopant concentration in a range from about $1.0 \times 10^{19}$ atoms/cm$^3$ to about $1.0 \times 10^{20}$ atoms/cm$^3$. In one embodiment, doped region 14 has a dopant concentration of about $2.0 \times 10^{15}$ atoms/cm$^3$ and buried layer 16 has a dopant concentration of about $1.0 \times 10^{19}$ atoms/cm$^3$. Doped region 14 and buried layer 16 can be doped with phosphorous, arsenic, or antimony, and they do not have to be doped with the same dopant species. Doped region 14 can have a thickness in a range from about 12 microns to about 18 microns, and buried layer 16 can have a thickness/depth in a range from about 3 microns to about 5 microns.

In some embodiments, doped region 14 and buried layer 16 can be formed using epitaxial growth techniques. In other embodiments, doped region 14, buried layer 16 and doped region 22 can be formed together using epitaxial growth techniques. In some embodiments, doped region 14 and/or buried layer 16 can be formed using ion implantation and diffusion techniques or other techniques as known to those of ordinary skill in the art. In one embodiment, doped region 14 can be formed using epitaxial growth techniques and buried layer 16 can formed using ion implantation techniques. The implanted dopant can be diffused separately or during the epitaxial growth process for forming doped region 22.

In one embodiment, doped region 13 further includes doped regions 17 or sinker regions 17 extending from major surface 18 on opposing sides of doped region 22. In one embodiment sinker regions 17 laterally surround doped region 22 and connect to buried layer 16 and/or doped region 14. In one embodiment, doped region 22 is enclosed on the sides and underneath by doped region 13.

Device 10 can further include isolation structures 20 extending from major surface 18 into region of semiconductor material 11. In one embodiment, isolation structures 20 can be deep trench isolation structures formed using deep reactive ion etching (DRIE) techniques and can be filled or lined using one or more dielectric materials. In other embodiments, isolation structures 20 can be diffused isolation structures. In one embodiment, isolation structures 20 can extend to or into semiconductor substrate 12. In one embodiment, isolation structures 20 are configured to provide isolation of device 10 from adjacent devices. In one embodiment, device 10 includes an insulating layer or layers 36 on or overlying major surface 18 and is formed having pre-selected openings for providing contact regions to certain doped regions of device 10. In one embodiment, insulating layer 36 can be an oxide material.

Device 10 further includes an electrode 38 electrically connected to doped regions 28 and 23 and an electrode 39 electrically connected to doped regions 31 and 26. In one embodiment, electrode 38 is configured as a cathode electrode and electrode 39 is configured as an anode electrode. In some embodiments, electrode 38 is further electrically connected to doped regions 32 and 22 as generally illustrated in FIG. 1. Electrodes 38 and 39 can be any materials suitable for providing ohmic contact to semiconductor devices. In one embodiment, electrodes 38 and 39 can be aluminum, an aluminum alloy, titanium/nickel/silver, chrome/nickel/gold, or other materials known to those of ordinary skill in the art. In some embodiments, another electrode layer can be disposed on major surface 19, which is not shown in the present embodiment, but is generally represented by terminal 25.

In one embodiment of device 10, p-type doped region 26 is electrically connected to electrode 39 through contact to doped region 31 within doped region 26. Doped region 26 is enclosed by n-type doped region 23, which is electrically connected to electrode 38 through contact to doped region 28 within doped region 23. Doped region 23 is enclosed by p-type doped region 22 or LPSUB layer 22, which can be connected to electrode 38 through doped region 32 within doped region 22. In other embodiments, doped region 22 can be electrically connected to electrode 38 using a conductive connection, such as a silicide layer connecting doped region 22 and doped region 23; a resistor structure connecting doped region 22 and doped region 23, or by other connective structures. P-type doped region 22 or LPSUB layer 22 is enclosed by doped region 13 or NEDGE region 13, which is disposed on or within substrate 12. Isolation structure 20 provides electrical separation of device 10 from other components or regions of integrated circuits containing device 10.

To illustrate one mode of operation of diode device 10 as a floating diode structure, doped region 13 or NEDGE region 13 is configured as an n-type region enclosing p-type region 22 or LPSUB layer 22. Semiconductor substrate 12 can either be left floating or can be connected to an external potential, for example, through terminal 25. In some embodiments, doped region 13 is left floating, for example, no low-ohmic external voltage is imposed onto n-type region 13. More particularly, in some embodiments, doped region 13 is not directly connected to electrode 39, electrode 38, the doped region 22 node or the substrate 12 node. In this configuration, the electrical potential of doped region 13 is thus established by doped region 22 and by substrate 12, which are on opposing sides of doped region 13, and/or by the parasitic effects from electrodes 38 and 39, substrate 12 and/or adjacent electrical components or regions as described hereinafter.

In the following description, the potential of doped region 13 can be sensed, for example, using a gate of a MOSFET device, a high ohmic resistor, a small current source, or other means as known to those of ordinary skill in the art. It is understood that such means of sensing the potential of doped region 13 may potentially introduce extra constraints and parasitic effects. For example, by sensing the potential of doped region 13 of floating diode 10, the voltage of doped region 13 needs to stay within the operating range of the connected sensing circuit, potentially limiting/constraining the allowable voltage range of doped region 13, and therefore the operating range of floating diode 10. Also, the input impedance of the sensing circuit needs to be sufficiently high in order not to generate unwanted parasitic effects. This can constrain, for example, the topologies used in the sensing circuit, the sizing/dimensioning of the devices connected to doped region 13. Also, when the input impedance of the sensing circuit connected to doped region 13 is sufficiently high, the potential of the doped region 13 can remain largely defined by the mechanisms described previously. Still, by sensing the potential of doped region 13 of floating diode 10, doped region 13 is not fully electrically floating. In addition, depending on the sign and magnitude of the current flowing from/to doped region 13 to/from the sensing circuit, and depending on the voltage on doped region 13 with respect to the neighboring doped regions, parasitic NPN 47 or 48, parasitic PNP 46 (illustrated in FIG. 2 and described below) may become activated, leading to unwanted parasitic injection of carriers.

Figure 2:
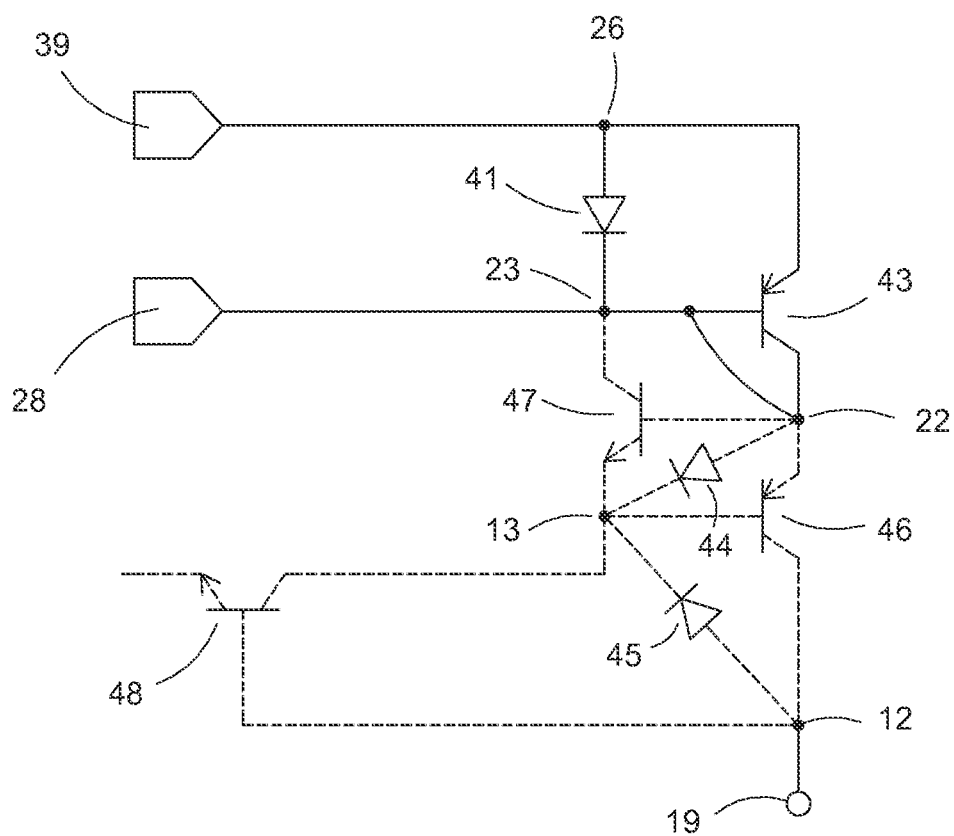
FIG. 2 is a circuit schematic illustrating connectivity and parasitic structures in the embodiment of FIG. 1.

The following description makes reference to FIG. 2, which is a circuit schematic illustrating the connectivity of the various components and describing various parasitic components of device 10 that can influence the potential on doped region 13 when in a floating configuration in accordance with one embodiment. As illustrated in FIG. 2, device 10 includes a diode 41 formed by doped region 26 (anode 39) and doped region 23 (cathode 38). Device 10 further includes a parasitic diode 44 formed by doped region 22 (anode) and doped region 13 (cathode); a parasitic diode 45 formed by semiconductor substrate 12 (anode) and doped region 13 (cathode); a parasitic PNP bipolar transistor 43 formed by doped region 26 (emitter), doped region 23 (base), and doped region 22 (collector); a parasitic PNP bipolar transistor 46 formed by doped region 22 (emitter), doped region 13 (base), and semiconductor substrate 12 (collector); a parasitic NPN bipolar transistor 47 formed by doped region 23 (collector), doped region 22 (base), and doped region 13 (emitter); a parasitic NPN bipolar transistor 48 formed by an adjacent n-type doped region 131 (emitter), semiconductor substrate 12 (base), and doped region 13 (collector).

In the present mode of operation, doped region 13 can be self-biased through the adjacent parasitic components within device 10 described previously. For example, doped region 13 can behave as the cathode of parasitic diode 44; or doped region 13 can behave as the cathode of parasitic diode 45. In addition, doped region 13 can be self-biased through parasitic NPN bipolar transistors within device 10. For example, doped region 13 can behave as the collector of parasitic NPN transistor 48; or doped region 13 can behave as the emitter of parasitic NPN transistor 47. Thus, the actual equilibrium potential on floating doped region 13 will depend on, among other things, one or more of the following factors: 1) how and whether doped region 22 is connected to electrode 38 (cathode), electrode 39 (anode), or not; 2) whether diode 41 is forward biased or reverse biased; or 3) what the potential is of semiconductor substrate 12 versus doped region 22.

In one embodiment of device 10 where doped region 13 is in a floating configuration, doped region 22 is electrically connected to electrode 38 of diode 41 using, for example, doped region 32, a metal layer, a silicide, a resistor, or by other connective structures. By electrically connecting doped region 22 to electrode 38, the holes injected into doped region 22 by parasitic PNP transistor 43 contribute to the forward diode current of device 10 because such holes now flow to electrode 38. Also because the majority of the injected holes are collected at electrode 38, the injected holes do not, at least initially, energize parasitic NPN transistor 47 and parasitic PNP transistor 46, which in accordance with the present embodiment lowers the injection of holes into semiconductor substrate 12.

In accordance with the present embodiment, when doped region 13 is floating and thus self-biased, the DC potential of doped region 13 is generally between the maximum potential of doped region 22 and semiconductor substrate 12 and the maximum potential of doped region 22 minus the forward voltage of parasitic diode 44 and semiconductor substrate 12 minus the forward voltage of parasitic diode 45. With doped region 13 left floating, doped region 13 thus forms an isolation barrier based on the potentials of adjacent regions. With the configuration of device 10, the voltages on the anode (doped region 26) and the cathode (doped region 23) of diode 41 are not significantly constrained by the voltage applied to terminal 25 or semiconductor substrate 12. Thus, diode 41 can freely float up and down with respect to the voltage applied to terminal 25.

In accordance with the present embodiment, the following describes various techniques configured to reduce parasitic effects in device 10. When diode 41 of device 10 is forward biased and electrode 39 is biased positive with respect to terminal 25, the vertical portion of parasitic PNP transistor 43 may indirectly inject some holes into semiconductor substrate 12. It is believed that one mechanism for this is that some holes injected into doped region 22 are not collected by electrode 38, and thus activate the base of parasitic NPN transistor 47. The resulting electron flow thus creates a potential drop over doped region 22, which can energize the vertical parasitic transistor 46. As a result, some portion of holes can be injected into semiconductor substrate 12.

It was discovered that the foregoing described hole injection can be reduced by reducing the resistance between where doped region 22 contacts electrode 38 and that portion of doped region 22 below doped region 23. In one embodiment, this can be done by reducing the width of the cathode area versus the total anode area (for example, by forming the cathode regions in narrow stripes or rings). In other embodiments, this can be done by reducing the area to perimeter ratio of the cathode for a given total anode area. In another embodiment, this can be done by maximizing the doped region 22 to exposed perimeter of the cathode by forming the cathode in square shapes, round dot-like shapes, octagon shapes, or other shapes. In further embodiments, this can be done by increasing the doping level of doped region 22. In still further embodiments, this can be done by reducing the gain of one or more of the parasitic bipolar transistors. For example, this can be done by increasing the doping level of doped region 22 to essentially eliminate the base region of parasitic NPN transistors 47 and/or by increasing the doping level of doped region 13 to eliminate the base of parasitic PNP transistor 46.

In another embodiment where diode 41 is reverse biased and electrode 38 is positive with respect to the bias on semiconductor substrate 12, electron leakage from semiconductor substrate 12 can slightly energize parasitic PNP bipolar 46. This can also result in the unwanted injection of holes into semiconductor substrate 12, which can be reduced by increasing the doping level of doped region 13 (for example, the doping level of buried layer 16).

FIGS. 3-6 are graphical data of one embodiment of device 10 configured as a 45 volt isolated diode (i.e., diode formed in its own isolation pocket) in both forward biased mode and reverse biased mode. These figures illustrate the functionality of one embodiment. With reference back to FIG. 1, for purposes of measurement, in the forward bias mode, voltage 51 is $V_{BIAS}$, and voltage 52 is equal to $V_{BIAS}$ plus the forward voltage $V_F$ of diode 41 with substrate 12 at zero volts. In the reverse bias mode, voltage 51 is equal to $V_{BIAS}$ and voltage 52 is equal to $V_{BIAS}$ minus the reverse voltage $V_R$ of diode 41 with substrate 12 at zero volts. Buried layer 16 of device 10 is left floating. To determine the substrate current and the $I_{SUB}/I_{ANODE}$ current ratio, indirect contact was made to substrate 12 using contact 320 in an adjacent pocket 319 through the doped region 131/substrate 12 n/p++ diode. Additionally, the following data was taken at 150 degrees Celsius.

Figure 3:
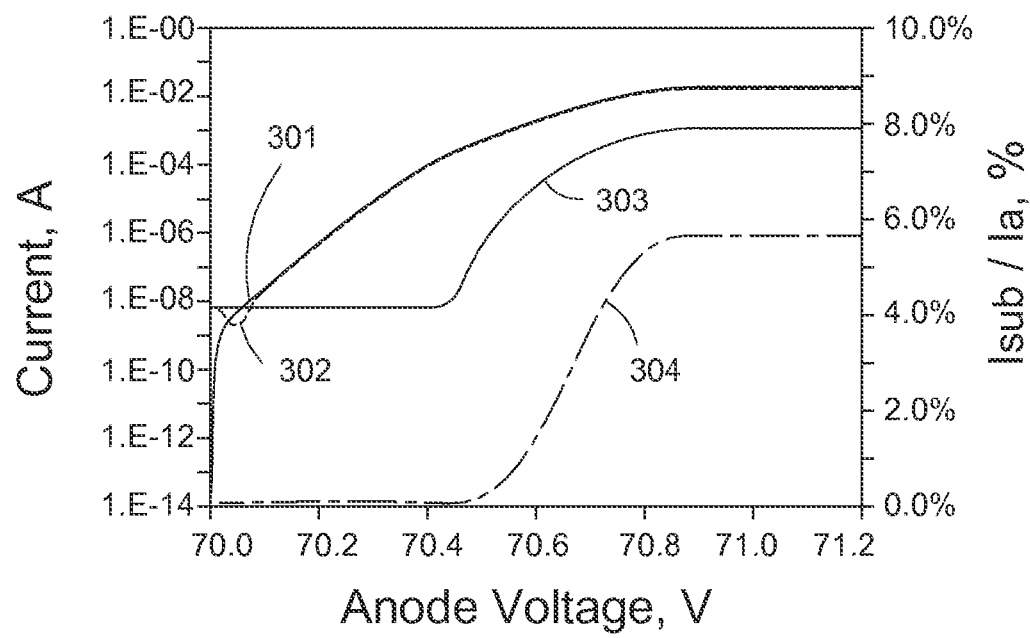
FIG. 3 illustrates graphical data of current versus voltage and the ratio of substrate current to anode current versus voltage for the embodiment of FIG. 1 biased above ground in a forward mode of operation.

FIG. 3 is current versus voltage data (curves 301, 302, and 303) for the forward characteristic of diode 10 with $V_{BIAS}$ at 70 volts above substrate 12 (ground) and $I_{SUB}/I_{ANODE}$ current ratio (%) versus voltage data (curve 304). Specifically, curve 301 is the measured anode current for device 10, curve 302 is the absolute value of measured cathode current, and curve 303 is the absolute value of measured substrate current. In the embodiment illustrated, anode current is substantially equal to doped region 22 current, which is dominated by the current of parasitic PNP transistor 43. In an alternative embodiment where buried layer 16 is reverse biased, parasitic PNP transistor 43 will turn on parasitic NPN transistor 47 at a voltage of approximately 0.8 volts, and then the current will flow from buried layer 16 to the cathode electrode. In an embodiment where doped region 13 (including buried layer 16) are left floating, a small portion of holes from the anode electrode may reach semiconductor substrate 12 through the barrier of buried layer 16 (greater than approximately 0.7 volts). As described previously, the amount of injected holes can be reduced by increasing the collector area of parasitic PNP transistor 43 and also by minimizing the vertical area of diode 41 (e.g., by minimizing the number of anode stripes).

Figure 4:
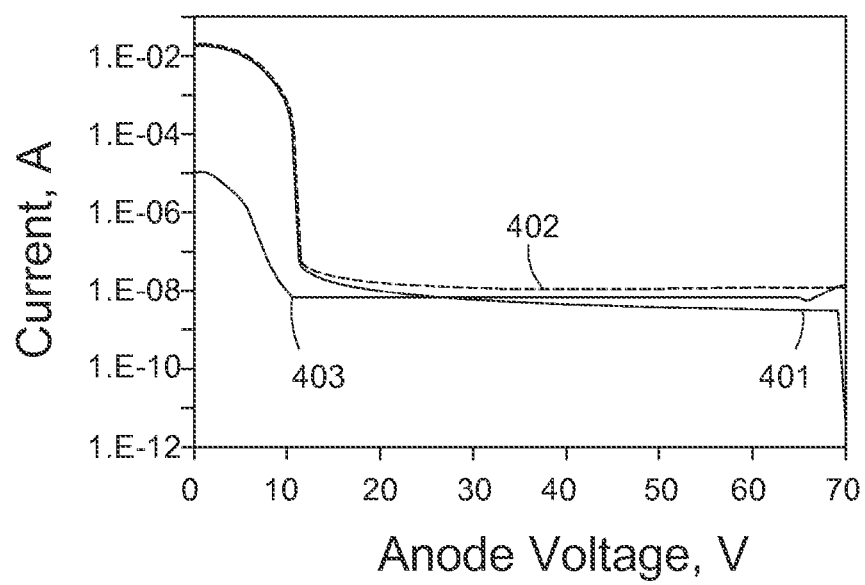
FIG. 4 illustrates graphical data of current versus voltage for the embodiment of FIG. 1 biased above ground in a reverse mode of operation.

FIG. 4 is current versus voltage data for the reverse characteristic of diode 10 with $V_{BIAS}$ at 70 volts above substrate 12 (ground). Specifically, curve 401 is the absolute value of the measured anode current, curve 402 is the measured cathode current, and curve 403 is the absolute value of the measured substrate current.

Figure 5:
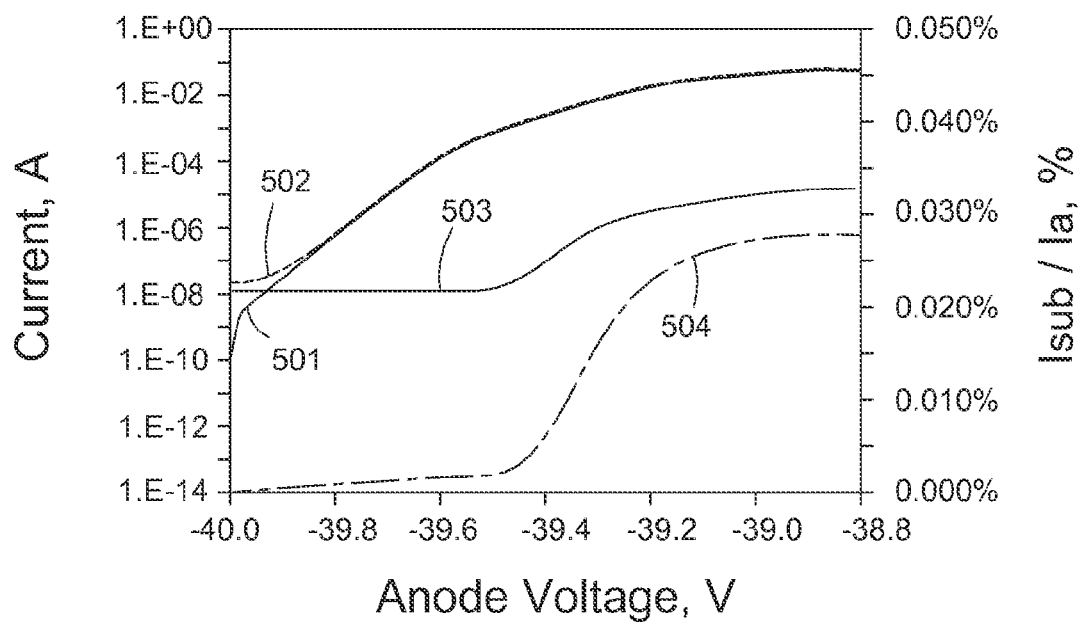
FIG. 5 illustrates graphical data of current versus voltage and the ratio of substrate current to anode current versus voltage for the embodiment of FIG. 1 biased below ground in a forward mode of operation.

FIG. 5 is current versus voltage data (curves 501, 502, and 503) for the forward characteristic of diode 10 with $V_{BIAS}$ at −40 volts below substrate 12 (ground) and $I_{SUB}/I_{ANODE}$ current ratio (%) versus voltage data (curve 504). Specifically, curve 501 is the measured anode current for device 10, curve 502 is the absolute value of measured cathode current, and curve 503 is the absolute value of measured substrate current.

Figure 6:
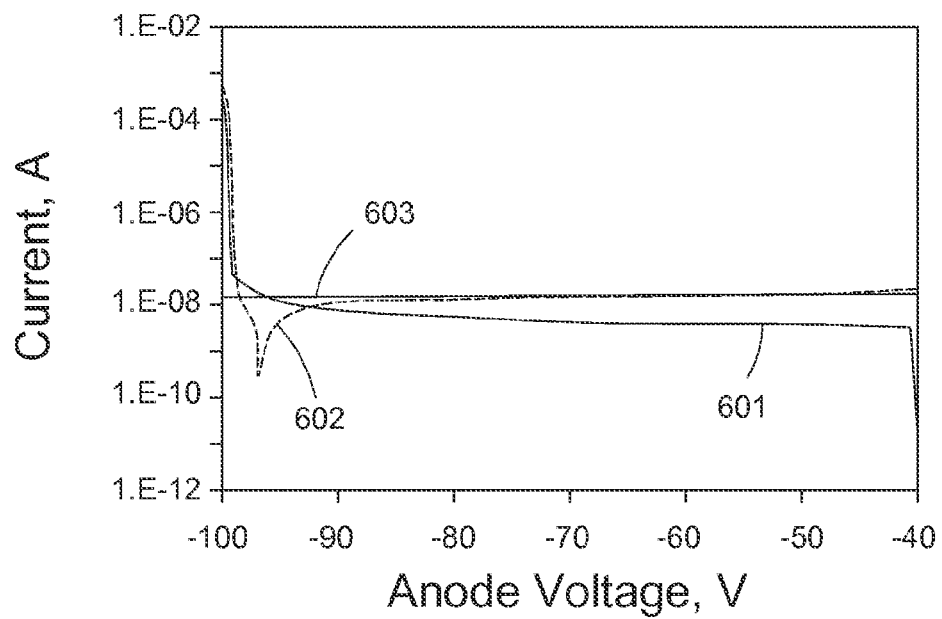
FIG. 6 illustrates graphical data of current versus voltage for the embodiment of FIG. 1 biased below ground in a reverse mode of operation.

FIG. 6 is current versus voltage data for the reverse characteristic of diode 10 with $V_{BIAS}$ at −40 volts above substrate 12 (ground). Specifically, curve 601 is the absolute value of the measured anode current, curve 602 is the measured cathode current, and curve 603 is the absolute value of the measured substrate current.

As the foregoing data shows, diode 10 is capable of operating with respect to substrate 12 both above ground potential and below ground potential (positive/negative bias) and capable of operating in both forward mode and reverse mode without significant current leakage to substrate 12 and/or any adjacent devices.

Figure 7:
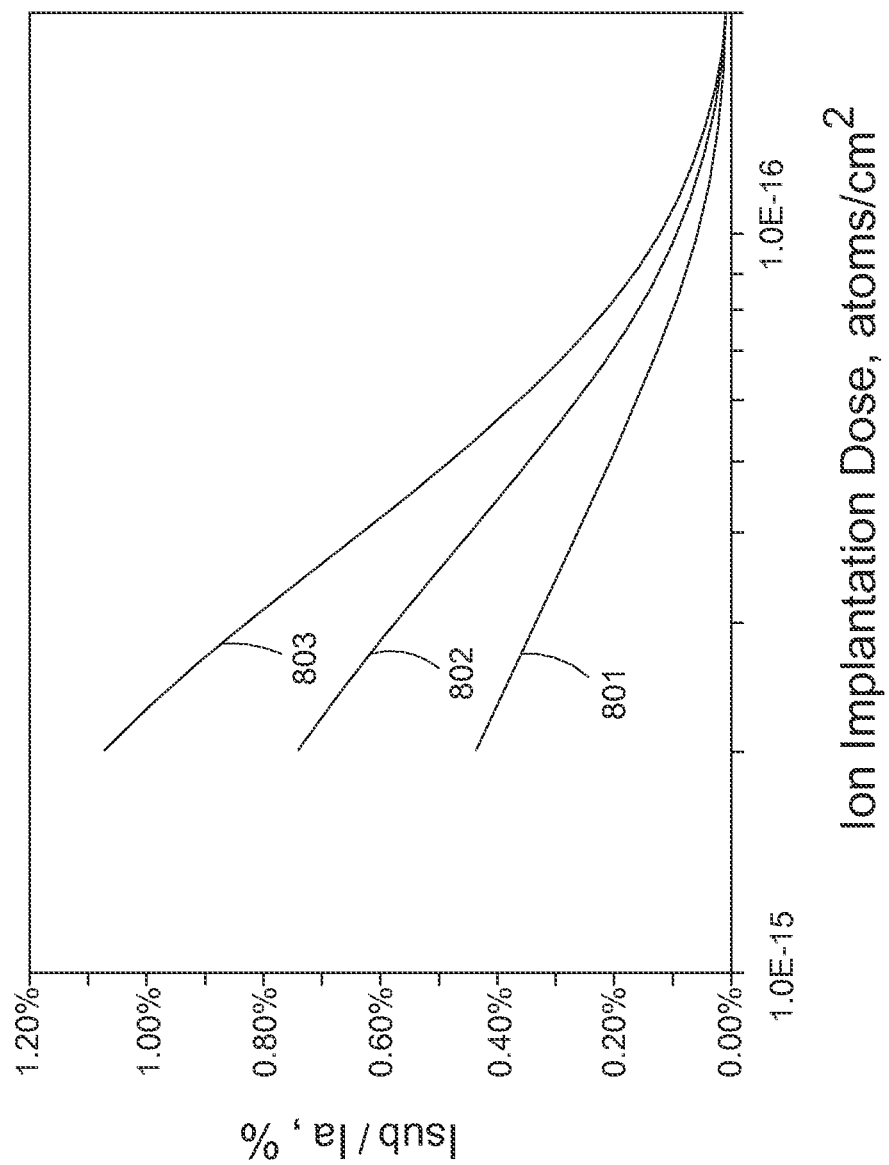
FIG. 7 illustrates graphical data of the ratio of substrate current to anode current versus ion implantation dosage used in fabricating a buried layer portion of the device of FIG. 1.

FIG. 7 is graphical data of $I_{SUB}/I_{ANODE}$ ratio (%) versus ion implantation dose (atoms/cm$^2$) for forming buried layer 16 in the fabrication of 45 volt floating diode embodiments of device 10. In these embodiments, the diode area was about 70 microns by about 140 microns. Curve 801 is data taken at 27 degrees Celsius, curve 802 is data taken at 90 degrees Celsius, and curve 803 is data taken at 150 degrees Celsius. This data further shows that by increasing the dopant concentration in buried layer 16 the $I_{SUB}/I_{ANODE}$ ratio drops significantly. In one embodiment, buried layer 16 is formed using an ion implantation dose greater than about $5.0 \times 10^{15}$ atoms/cm$^2$. In another embodiment, buried layer 16 is formed using an ion implantation dose greater than about $7.0 \times 10^{15}$ atoms/cm$^2$. In a further embodiment, buried layer 16 is formed using an ion implantation dose greater than about $1.0 \times 10^{16}$ atoms/cm$^2$. In still other embodiments, buried layer 16 has a peak dopant concentration greater than about $1.0 \times 10^{20}$ atoms/cm$^3$.

Figure 8:
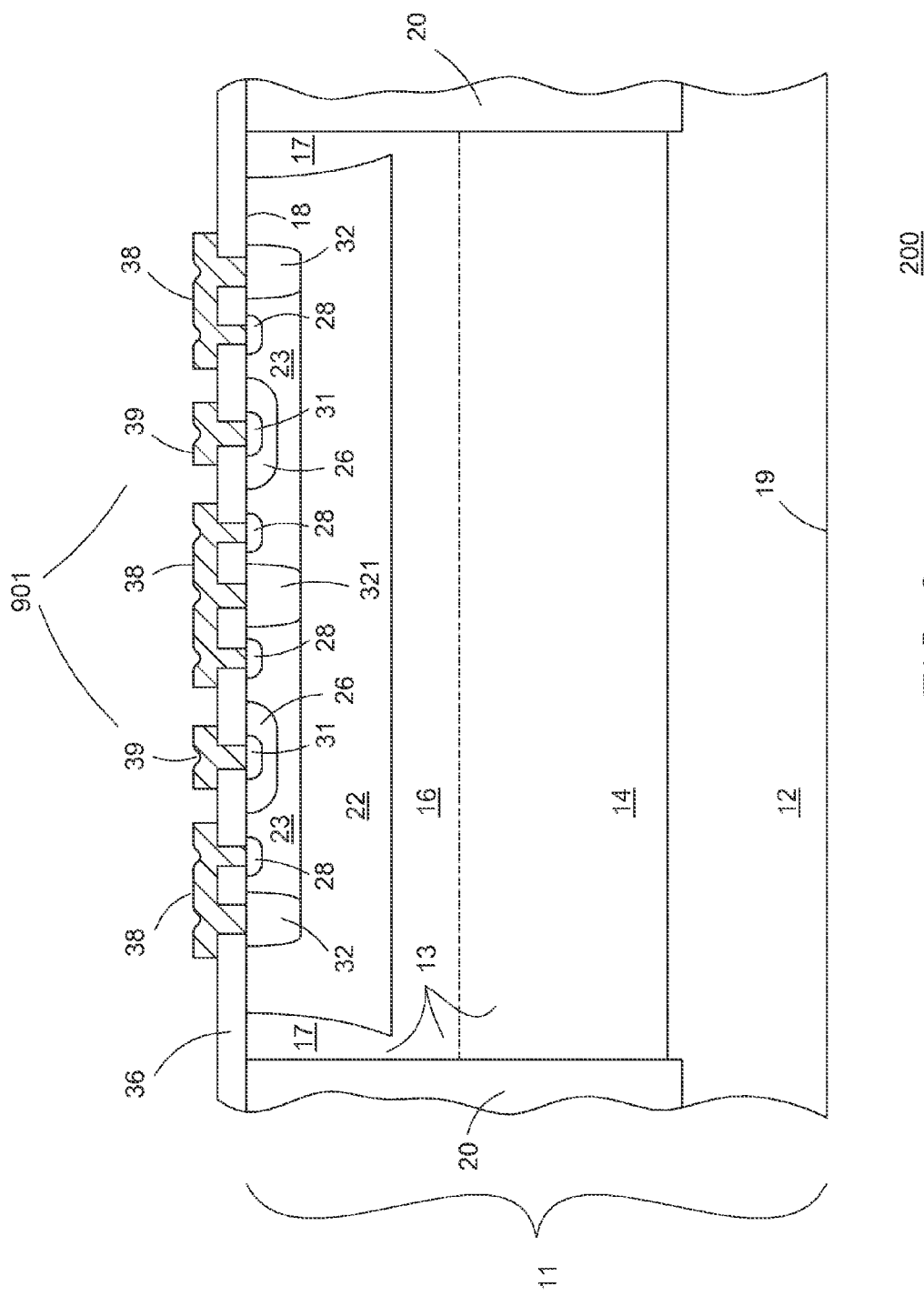
FIG. 8 illustrates an enlarged cross-sectional view of another embodiment of a semiconductor device in accordance with the present invention.
Figure 9:
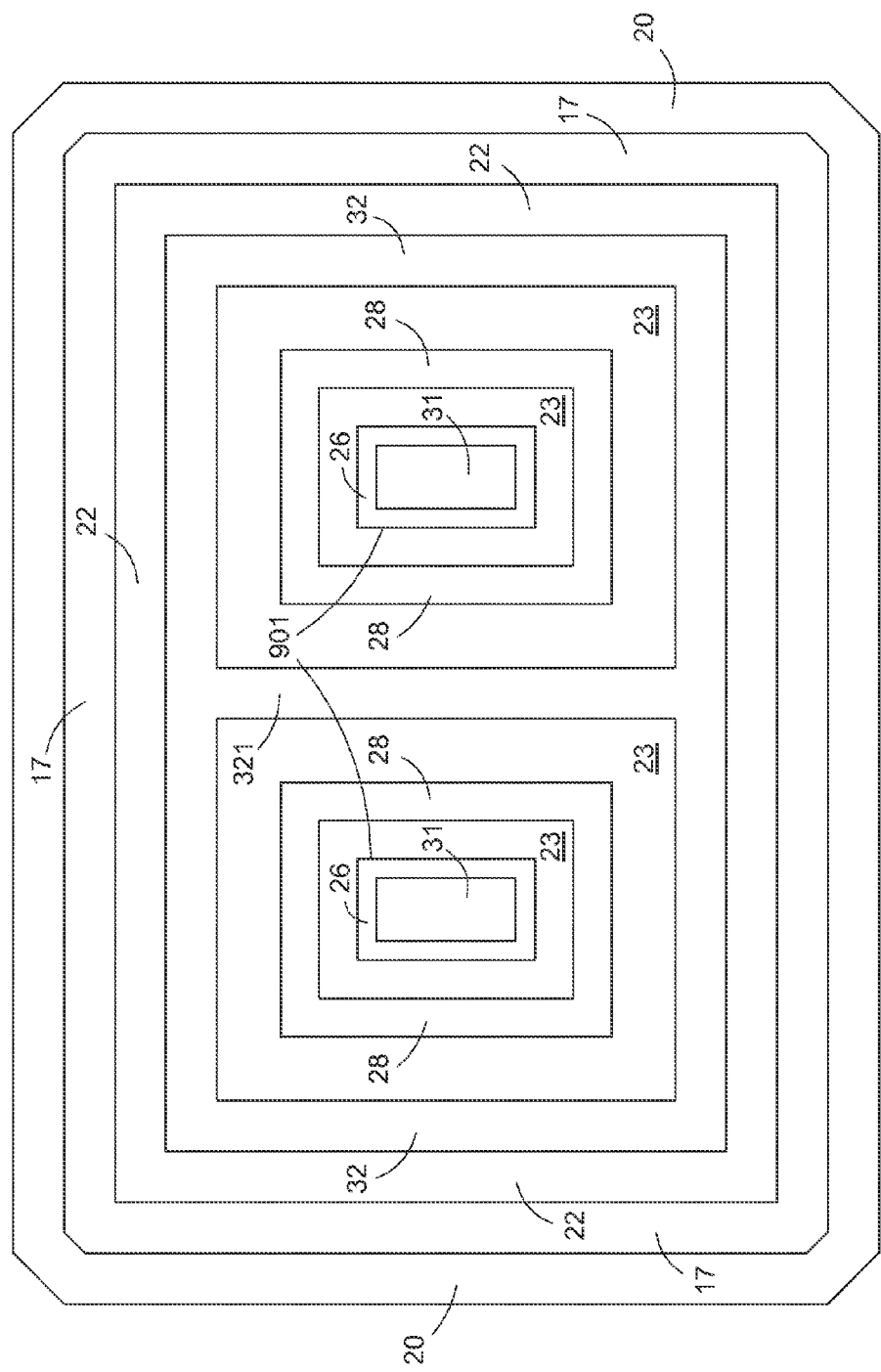
FIG. 9 illustrates a top plan view of a portion of the device of FIG. 8.

FIG. 8 illustrates an enlarged partial cross-sectional view of an electronic device 200, a semiconductor device 200, or floating diode device 200 in accordance with another embodiment. FIG. 9 illustrates a top plan view of device 200 with layers 36, 38, and 39 removed for ease of illustrating the present embodiment. Device 200 is similar to device 10 and only the differences will be described hereinafter.

Device 200 includes a pair 901 of anode regions 26, doped regions 26, or anode stripes 26, which are each surrounded by doped regions 28 (which provide ohmic-like contact to cathode regions 23). In this embodiment, doped region 32 or p-ring 32 includes a portion 321 that is placed between pair 901 of anode regions 26. In accordance with the present embodiment, portion 321 of doped region 32 is configured to further help reduce the injection of holes from parasitic PNP transistor 43 into substrate 12 thereby improving the performance of diode 41 compared to embodiments that do not have portion 321.

Figure 10:
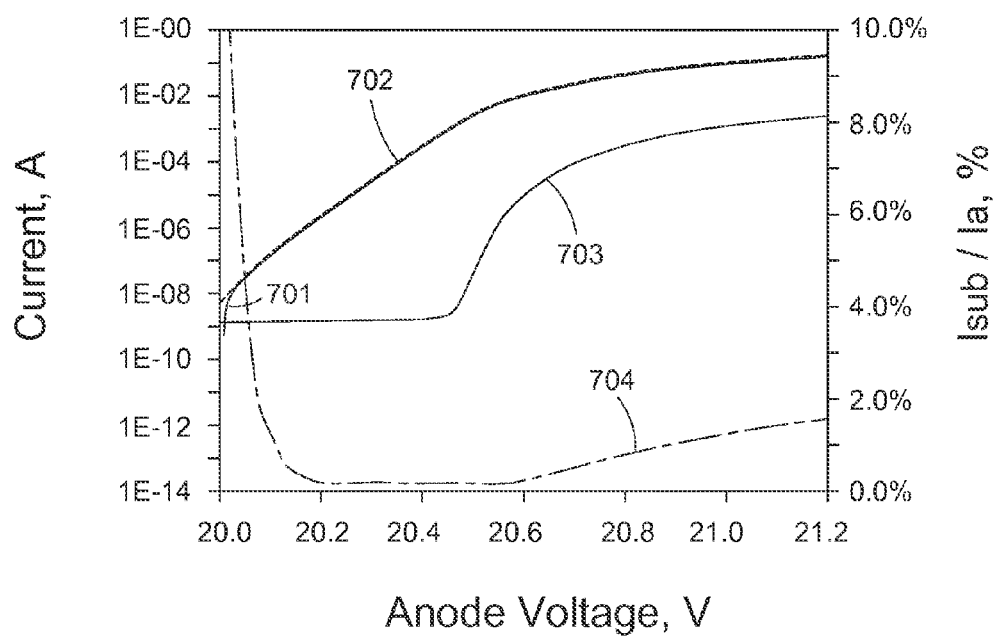
FIG. 10 illustrates graphical data of current versus voltage and the ratio substrate current to anode current versus voltage for the embodiment of FIG. 8 biased above ground in a forward mode of operation.

FIG. 10 is graphical data of current versus voltage data (curves 701, 702, and 703) for a forward characteristic of device 200 of FIGS. 8 and 9 with $V_{BIAS}$ at 20 volts above substrate 12 (ground) and $I_{SUB}/I_{ANODE}$ current ratio (%) versus voltage data (curve 704) at 150 degrees Celsius. Specifically, curve 701 is the measured anode current for this embodiment of device 200, curve 702 is the absolute value of measured cathode current, and curve 703 is the absolute value of measured substrate current. As this data shows, the addition of portion 321 of device 200 improves $I_{SUB}/I_{ANODE}$ current ratio performance compared to device 10 because portion 321 is configured to collect more holes laterally.

In summary, in the embodiments described herein, all of the diode terminals can float freely (both positive as well as negative, but subject to breakdown voltage and punch through limitations) versus adjacent circuit elements and versus the substrate (i.e., substrate 12). In some embodiments, the layers adjacent to the diode (for example, doped region 13) are self-biased to a potential that facilitates the above noted degrees of freedom. Using techniques including, but limited to those described herein (either singularly or in combination), the parasitic injection of carriers into substrate 12 particularly during forward bias mode can be reduced to enhance the performance of the diode device. Also, embodiments of the diode have been measured as described herein and show good performance characteristics in forward mode and reverse mode with low substrate injection in various operation modes.

Device 10 and its various embodiments can be configured, for example, for applications requiring a fully floating high voltage diode in both the forward mode and the reverse mode. That is, applications requiring a diode capable of floating positive and negative versus the bulk substrate (e.g., substrate 12). Device 10 and its various embodiments can be further configured for applications requiring or benefitting from a low injection high voltage diode. Applicable applications include, but are not limited to, reverse battery protection circuits, bootstrap loader circuits, charge pump circuits, reverse blocking diodes in circuit branches, low injection flyback diodes, ESD diode circuits for protecting nodes under negative bias, and other circuits known to those of ordinary skill in the art. Additionally, because of its non-rectification and non-linearity versus the substrate, device 10 provides for improved EMI performance, which is important in automotive applications. Finally, device 10 provides a better isolated ESD/clamping diode configuration with more degrees of freedom compared to related ESD diodes.

From all of the foregoing, one skilled in the art can determine that, according to one embodiment, a semiconductor device (for example, element 10, 200) comprises a semiconductor substrate of a first conductivity type (for example, element 12). A first doped region of a second conductivity type (for example, element 13) opposite to the first conductivity type is disposed on the semiconductor substrate. A second doped region of the first conductivity type (for example, element 22) is disposed adjacent the first doped region. A cathode region of the second conductivity type (for example, element 23) is disposed within the second doped region and an anode region of the first conductivity type (for example, element 26) is disposed within the cathode region. A first electrode (for example, element 39) is electrically coupled to the anode region and a second electrode (for example, element 38) is electrically coupled to the cathode region and the second doped region, wherein first doped region is configured as a floating region.

From all of the foregoing, one skilled in the art can determine that, according to another embodiment, the first doped region can comprise a first portion (for example, element 14) adjacent the substrate and having a first doping concentration and a second portion (for example, element 16) adjacent the first portion and the second doped region having a second doping concentration, wherein the second doping concentration is greater than the first doping concentration, and wherein the second doping concentration is selected to reduce current injection into the semiconductor substrate. In a further embodiment, the second doping concentration can be greater than about $1.0 \times 10^{20}$ atoms/cm$^3$. In a still further embodiment, the first doped region can further comprise sinker portions (for example, element 17) that laterally surround the second doped region. In another embodiment, the first doped region is configured to be self-biased by one or more of the second doped region and the semiconductor substrate. In a further embodiment, the anode region can be configured as a pair of stripe regions (for example, element 901). In a still further embodiment, the semiconductor device can further comprise a third doped region of the first conductivity type (for example, element 32, 321) within the second doped region, wherein a portion (for example, element 321) of the third doped region extends between the pair of stripe regions. In another embodiment, the semiconductor device can further comprise a fourth doped region of the second conductivity type (for example, element 28) within a portion of the cathode region and laterally surrounding one of the pair of stripes; a fifth doped region of the second conductivity type (for example, element 28) within the another portion of the cathode region and laterally surrounding another one of the pair of stripes, wherein the fourth doped region and fifth doped region are electrically coupled to the second electrode. In a further embodiment, the third doped region can be electrically coupled to the second electrode. In a still further embodiment, the cathode region can be disposed apart from edge portions of the second doped region, and the second doped region can be electrically coupled to the second electrode between an edge portion and the second doped region.

From all of the foregoing, one skilled in the art can determine that, according to a further embodiment, a semiconductor diode structure (for example, element 10, 200) comprises a semiconductor substrate of a first conductivity type (for example, element 12). A first doped region of a second conductivity type (for example, element 13) opposite to the first conductivity type, the first doped region having a first portion (for example, element 14) disposed adjacent the semiconductor substrate and has a first doping concentration and a second portion (for example, element 16) disposed adjacent the first portion and having a second doping concentration greater than the first doping concentration. A second doped region of the first conductivity type (for example, element 22) is disposed adjacent the second portion of the first doped region. A cathode region of the second conductivity type (for example, element 23) is disposed within the second doped region and an anode region of the first conductivity type (for example, element 26) is disposed within the cathode region, wherein the cathode region and anode region form the semiconductor diode. A first electrode (for example, element 39) is electrically coupled to the anode region and a second electrode (for example, element 38) is electrically coupled to the cathode region, wherein the first doped region is configured to operate absent a low-ohmic external voltage imposed on the first doped region, and wherein the second doping concentration is selected to reduce current injection from the semiconductor diode into the semiconductor substrate.

From all of the foregoing, one skilled in the art can determine that according to another embodiment, the second doped region can be electrically coupled to the second electrode. In a further embodiment, the second doping concentration within at least a part of the second portion is greater than about $1.0 \times 10^{20}$ atoms/cm³. In a still further embodiment, the first doped region further comprises sinker portions (for example, element 17) that laterally surround the second doped region. In another embodiment, the anode region is configured as a pair of stripe regions (for example, element 901). In a further embodiment, the structure further comprises a third doped region of the first conductivity type (for example, element 32, 321) within the second doped region, wherein a portion (for example element 321) of the third doped region extends between the pair of stripe regions. In a still further embodiment, the third doped region can be electrically connected to the second electrode. In another embodiment, the first doped region is configured so that no low-ohmic external voltage is imposed upon the first doped region. In a further embodiment, the first doped region is not connected to the electrical nodes of the anode region, the cathode region, the second doped region, or the semiconductor substrate.

From all of the foregoing, one skilled in the art can determine that according to further embodiment, a method of forming a semiconductor device (for example, element 10, 200) comprises providing a semiconductor substrate of a first conductivity type (for example, element 12), a first doped region of a second conductivity type (for example, element 13) opposite to the first conductivity type is disposed on the semiconductor substrate, and a second doped region of the first conductivity type (for example, element 22) is disposed adjacent the first doped region. The method includes forming a cathode region of the second conductivity type (for example, element 23) within the second doped region and forming an anode region of the first conductivity type (for example, element 26) within the cathode region. The method includes forming a first electrode (for example, element 39) coupled to the anode region and forming second electrode (for example, element 38) coupled to the cathode region and the second doped region, wherein first doped region is configured as a floating region.

From all of the foregoing, one skilled in the art can determine that according to another embodiment, providing the first doped region comprises providing a first portion (for example, element 14) adjacent the substrate and having a first doping concentration and providing a second portion (for example, element 16) adjacent the first portion and the second doped region having a second doping concentration, wherein the second doping concentration is greater than the first doping concentration, and wherein the second doping concentration is selected to reduce current injection into the semiconductor substrate. In a further embodiment, providing the second portion can include providing the second doping concentration greater than about $1.0 \times 10^{20}$ atoms/cm³. In yet a further embodiment, providing the second portion can comprise ion implanting an n-type dopant into the first portion at an ion implantation dose greater than about $5.0 \times 10^{15}$ atoms/cm². In a still further embodiment, providing the second portion can comprise ion implanting an n-type dopant into the first portion at an ion implantation dose greater than about $7.0 \times 10^{15}$ atoms/cm². In another embodiment, providing the second portion can comprise ion implanting an n-type dopant into the first portion at an ion implantation dose greater than about $1.0 \times 10^{16}$ atoms/cm². In a further embodiment, the method can further comprise forming sinker portions of the second conductivity type (for example, element 17) laterally surround the second doped region. In still further embodiment, forming the anode region can comprise forming anode region including a pair of stripe regions (for example, element 901). In another embodiment, the method can further comprise forming a third doped region of the first conductivity type (for example, element 32, 321) within the second doped region, wherein a portion (for example, element 321) of the third doped region extends between the pair of stripe regions.

In view of all of the above, it is evident that a novel structure and method of making the structure are disclosed. Included, among other features, is a lateral diode structure formed within an underlying bulk substrate that is separated from the underlying substrate by a floating doped region. In some embodiments, the floating doped region can surround or enclose the lateral diode structure. In one embodiment, the floating doped region includes an n-type buried layer and an n-type epitaxial layer between the n-type buried layer and the substrate having a lower dopant concentration than the n-type buried layer. In some embodiments, the dopant concentration of the n-type buried layer is pre-selected or pre-determined to reduce carrier injection into the underlying substrate. In one embodiment, a pair of anodes of the lateral diode structure is separated by a ring region configured to reduce injection current into the substrate. The structure provides a fully floating high voltage diode in both the forward mode and the reverse mode. Additionally, the structure avoids the thermal resistance issues associated with SOI devices.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:
1. A semiconductor device comprising:
  a semiconductor substrate of a first conductivity type;
  a first doped region of a second conductivity type opposite to the first conductivity type on the semiconductor substrate;
  a second doped region of the first conductivity type adjacent the first doped region;

a cathode region of the second conductivity type within the second doped region;

an anode region of the first conductivity type within the cathode region;

a first electrode electrically coupled to the anode region; and a second electrode electrically coupled to the cathode region and the second doped region, wherein the first doped region is configured as a floating region.

2. The semiconductor device of claim 1, wherein the first doped region comprises:

a first portion adjacent the substrate and having a first doping concentration; and a second portion adjacent the first portion and the second doped region, wherein the second portion has a second doping concentration, and wherein the second doping concentration is greater than the first doping concentration, and wherein the second doping concentration is selected to reduce current injection into the semiconductor substrate.

3. The semiconductor device of claim 2, wherein the second doping concentration is greater than about $1.0\times10^{20}$ atoms/cm$^3$.

4. The semiconductor device of claim 2, wherein the first doped region further comprises sinker portions that laterally surround the second doped region.

5. The semiconductor device of claim 1, wherein the first doped region is configured to be self-biased by one or more of the second doped region and the semiconductor substrate.

6. The semiconductor device of claim 1, wherein the anode region comprises a pair of stripe regions.

7. The semiconductor device of claim 6 further comprising a third doped region of the first conductivity type within the second doped region, wherein a portion of the third doped region extends between the pair of stripe regions.

8. The semiconductor device of claim 7 further comprising:

a fourth doped region of the second conductivity type within a portion of the cathode region and laterally surrounding one of the pair of stripes; and a fifth doped region of the second conductivity type within another portion of the cathode region and laterally surrounding another one of the pair of stripes, wherein the fourth doped region and fifth doped region are electrically coupled to the second electrode.

9. The semiconductor device of claim 7, wherein the third doped region is electrically coupled to the second electrode.

10. The semiconductor device of claim 1, wherein the cathode region is disposed apart from edge portions of the second doped region, and wherein the second doped region is electrically coupled to the second electrode between an edge portion and the second doped region.

11. A semiconductor diode structure comprising:

a semiconductor substrate of a first conductivity type;

a first doped region of a second conductivity type opposite to the first conductivity type, the first doped region having a first portion adjacent the semiconductor substrate and having a first doping concentration and a second portion adjacent the first portion and having a second doping concentration greater than the first doping concentration;

a second doped region of the first conductivity type adjacent the second portion of the first doped region;

a cathode region of the second conductivity type within the second doped region;

an anode region of the first conductivity type within the cathode region, wherein the cathode region and anode region form the semiconductor diode;

a first electrode electrically coupled to the anode region; and a second electrode electrically coupled to the cathode region, wherein the first doped region is configured to operate absent a low-ohmic external voltage imposed on the first doped region, and wherein the second doping concentration is selected to reduce current injection from the semiconductor diode into the semiconductor substrate.

12. The structure of claim 11, wherein second doped region is electrically coupled to the second electrode.

13. The structure of claim 11, wherein the second doping concentration within at least a part of the second portion is greater than about $1.0\times10^{20}$ atoms/cm$^3$.

14. The structure of claim 11, wherein the first doped region further comprises sinker portions that laterally surround the second doped region.

15. The structure of claim 11, wherein the anode region comprises a pair of stripe regions, the structure further comprising:

a third doped region of the first conductivity type within the second doped region, wherein a portion of the third doped region extends between the pair of stripe regions.

16. A method of forming a semiconductor device comprising:

providing a semiconductor substrate of a first conductivity type, a first doped region of a second conductivity type opposite to the first conductivity type on the semiconductor substrate, and a second doped region of the first conductivity type adjacent the first doped region;

forming a cathode region of the second conductivity type within the second doped region;

forming an anode region of the first conductivity type within the cathode region;

forming a first electrode coupled to the anode region; and forming a second electrode coupled to the cathode region and the second doped region, wherein the first doped region is configured as a floating region.

17. The method of claim 16, wherein providing the first doped region comprises:

providing a first portion adjacent the substrate and having a first doping concentration; and providing a second portion adjacent the first portion and the second doped region having a second doping concentration, wherein the second doping concentration is greater than the first doping concentration, and wherein the second doping concentration is selected to reduce current injection into the semiconductor substrate.

18. The method of claim 17, wherein providing the second portion includes providing the second doping concentration greater than about $1.0\times10^{20}$ atoms/cm$^3$.

19. The method of claim 16, further comprising forming sinker portions of the second conductivity type laterally surrounding the second doped region.

20. The method of claim 16, wherein forming the anode region comprises forming the anode region including a pair of stripe regions, and wherein the method further comprises forming a third doped region of the first conductivity type within the second doped region, and wherein a portion of the third doped region extends between the pair of stripe regions.

* * * * *